(12) United States Patent
Xu et al.

(10) Patent No.: US 8,076,386 B2
(45) Date of Patent: Dec. 13, 2011

(54) MATERIALS FOR IMPRINT LITHOGRAPHY

(75) Inventors: Frank Y. Xu, Austin, TX (US); Michael P. C. Watts, Austin, TX (US); Nicholas A. Stacey, Austin, TX (US)

(73) Assignees: Molecular Imprints, Inc., Austin, TX (US); Board of Regents, The University of Texas, Austin, TX (US)

( * ) Notice: Subject to any disclaimer, the term of this patent is extended or adjusted under 35 U.S.C. 154(b) by 1523 days.

(21) Appl. No.: 10/784,911

(22) Filed: Feb. 23, 2004

(65) Prior Publication Data

US 2005/0187339 A1    Aug. 25, 2005

(51) Int. Cl.
*C08J 7/16*    (2006.01)
*C08J 7/18*    (2006.01)
*C08K 3/00*    (2006.01)
*C08K 5/54*    (2006.01)
*C08K 5/541*   (2006.01)

(52) U.S. Cl. ................ 522/1; 522/74; 522/99; 526/206; 526/279

(58) Field of Classification Search ................ 522/1, 74, 522/99; 526/206, 279
See application file for complete search history.

(56) References Cited

U.S. PATENT DOCUMENTS

| | | |
|---|---|---|
| 3,527,062 A | 9/1970 | Bilinski et al. |
| 3,783,520 A | 1/1974 | King |
| 3,807,027 A | 4/1974 | Heisler |
| 3,807,029 A | 4/1974 | Troeger |
| 3,810,874 A | 5/1974 | Mitsch et al. |
| 3,811,665 A | 5/1974 | Seelig |
| 3,919,351 A | 11/1975 | Chang et al. |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,251,277 A | 2/1981 | Martin |
| 4,267,212 A | 5/1981 | Sakawaki |
| 4,271,258 A | 6/1981 | Watariguchi |
| 4,326,805 A | 4/1982 | Feldman et al. |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,512,848 A | 4/1985 | Deckman et al. |
| 4,514,439 A | 4/1985 | Rounds |
| 4,517,337 A | 5/1985 | Lockhart et al. |
| 4,544,572 A | 10/1985 | Sandvig et al. |
| 4,552,832 A | 11/1985 | Blume et al. |
| 4,552,833 A | 11/1985 | Ito et al. |
| 4,600,309 A | 7/1986 | Fay |
| 4,610,442 A | 9/1986 | Oku et al. |
| 4,614,667 A | 9/1986 | Larson et al. |
| 4,617,238 A | 10/1986 | Crivello et al. |
| 4,657,845 A | 4/1987 | Frechet et al. |
| 4,687,707 A | 8/1987 | Matsuo et al. |
| 4,692,205 A | 9/1987 | Sachdev et al. |
| 4,694,703 A | 9/1987 | Routson |
| 4,707,218 A | 11/1987 | Giammarco et al. |
| 4,722,878 A | 2/1988 | Watakabe et al. |
| 4,724,222 A | 2/1988 | Feldman |
| 4,731,155 A | 3/1988 | Napoli et al. |
| 4,737,425 A | 4/1988 | Lin et al. |
| 4,763,886 A | 8/1988 | Takei |
| 4,808,511 A | 2/1989 | Holmes |
| 4,826,943 A | 5/1989 | Ito et al. |
| 4,846,931 A | 7/1989 | Gmitter et al. |
| 4,848,911 A | 7/1989 | Uchida et al. |
| 4,857,477 A | 8/1989 | Kanamori |
| 4,883,561 A | 11/1989 | Gmitter et al. |
| 4,891,303 A | 1/1990 | Garza et al. |
| 4,908,298 A | 3/1990 | Hefferon et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |

(Continued)

FOREIGN PATENT DOCUMENTS

DE    2800476    7/1978

(Continued)

OTHER PUBLICATIONS

Abstract of Japanese Patent 02-24848, Jan. 26, 1990.

(Continued)

*Primary Examiner* — Kelechi Egwim
(74) *Attorney, Agent, or Firm* — Heather L. Flanagan; Fish & Richardson P.C.; Cameron A. King (57) ABSTRACT

The present invention is directed to a material for use in imprint lithography that features a composition having a viscosity associated therewith and including a surfactant, a polymerizable component, and an initiator responsive to a stimuli to vary the viscosity in response thereto, with the composition, in a liquid state, having the viscosity being lower than about 100 centipoises, a vapor pressure of less than about 20 Torr, and in a solid cured state a tensile modulus of greater than about 100 MPa, a break stress of greater than about 3 MPa and an elongation at break of greater than about 2%.

19 Claims, 3 Drawing Sheets

U.S. PATENT DOCUMENTS

| | | | |
|---|---|---|---|
| 4,959,252 A | 9/1990 | Bonnebat et al. | |
| 4,964,945 A | 10/1990 | Calhoun | |
| 4,976,818 A | 12/1990 | Hashimoto et al. | |
| 4,980,316 A | 12/1990 | Huebner | |
| 4,988,274 A | 1/1991 | Kenmochi | |
| 4,999,280 A | 3/1991 | Hiraoka | |
| 5,028,366 A | 7/1991 | Harakal et al. | |
| 5,053,318 A | 10/1991 | Gulla et al. | |
| 5,063,321 A | 11/1991 | Carter | |
| 5,071,694 A | 12/1991 | Uekita et al. | |
| 5,072,126 A | 12/1991 | Progler | |
| 5,073,230 A | 12/1991 | Maracas et al. | |
| 5,074,667 A | 12/1991 | Miyatake | |
| 5,108,875 A | 4/1992 | Thackeray et al. | |
| 5,110,514 A | 5/1992 | Soane | |
| 5,126,006 A | 6/1992 | Cronin et al. | |
| 5,148,036 A | 9/1992 | Matsugu et al. | |
| 5,148,037 A | 9/1992 | Suda et al. | |
| 5,149,592 A * | 9/1992 | Wojnarowicz | 428/447 |
| 5,151,754 A | 9/1992 | Ishibashi et al. | |
| 5,169,494 A | 12/1992 | Hashimoto et al. | |
| 5,173,393 A | 12/1992 | Sezi et al. | |
| 5,179,863 A | 1/1993 | Uchida et al. | |
| 5,198,326 A | 3/1993 | Hashimoto et al. | |
| 5,204,381 A | 4/1993 | Zeigler | |
| 5,204,739 A | 4/1993 | Domenicali | |
| 5,206,983 A | 5/1993 | Guckel et al. | |
| 5,212,147 A | 5/1993 | Sheats | |
| 5,234,793 A | 8/1993 | Sebald et al. | |
| 5,240,550 A | 8/1993 | Boehnke et al. | |
| 5,240,878 A | 8/1993 | Fitzsimmons et al. | |
| 5,242,711 A | 9/1993 | DeNatale et al. | |
| 5,244,818 A | 9/1993 | Jokerst et al. | |
| 5,259,926 A | 11/1993 | Kuwabara et al. | |
| 5,270,984 A | 12/1993 | Mine | |
| 5,277,749 A | 1/1994 | Griffith et al. | |
| 5,298,556 A | 3/1994 | Stephens | |
| 5,314,731 A | 5/1994 | Yoneda et al. | |
| 5,314,772 A | 5/1994 | Kozicki et al. | |
| 5,318,870 A | 6/1994 | Hartney | |
| 5,324,683 A | 6/1994 | Fitch et al. | |
| 5,328,810 A | 7/1994 | Lowrey et al. | |
| 5,330,881 A | 7/1994 | Sidman et al. | |
| 5,331,020 A | 7/1994 | Brown et al. | |
| 5,348,616 A | 9/1994 | Hartman et al. | |
| 5,362,606 A | 11/1994 | Hartney et al. | |
| 5,366,851 A | 11/1994 | Novembre | |
| 5,369,722 A | 11/1994 | Heming et al. | |
| 5,374,454 A | 12/1994 | Bickford et al. | |
| 5,376,810 A | 12/1994 | Hoenk et al. | |
| 5,380,474 A | 1/1995 | Rye et al. | |
| 5,389,696 A | 2/1995 | Dempsey et al. | |
| 5,392,123 A | 2/1995 | Marcus et al. | |
| 5,417,802 A | 5/1995 | Obeng | |
| 5,421,981 A | 6/1995 | Leader et al. | |
| 5,422,295 A | 6/1995 | Choi et al. | |
| 5,424,549 A | 6/1995 | Feldman | |
| 5,425,848 A | 6/1995 | Haisma et al. | |
| 5,425,964 A | 6/1995 | Southwell et al. | |
| 5,431,777 A | 7/1995 | Austin et al. | |
| 5,439,766 A | 8/1995 | Day et al. | |
| 5,452,090 A | 9/1995 | Progler et al. | |
| 5,453,157 A | 9/1995 | Jeng | |
| 5,458,520 A | 10/1995 | DeMercurio et al. | |
| 5,468,542 A | 11/1995 | Crouch | |
| 5,480,047 A | 1/1996 | Tanigawa et al. | |
| 5,482,768 A | 1/1996 | Kawasato et al. | |
| 5,512,131 A | 4/1996 | Kumar et al. | |
| 5,515,167 A | 5/1996 | Ledger et al. | |
| 5,523,878 A | 6/1996 | Wallace et al. | |
| 5,527,662 A | 6/1996 | Hashimoto et al. | |
| 5,542,978 A | 8/1996 | Kindt-Larsen et al. | |
| 5,545,367 A | 8/1996 | Bae et al. | |
| 5,566,584 A | 10/1996 | Briganti | |
| 5,594,042 A | 1/1997 | Glover et al. | |
| 5,601,641 A | 2/1997 | Stephens | |
| 5,629,095 A | 5/1997 | Bujanowski et al. | |
| 5,633,505 A | 5/1997 | Chung et al. | |
| 5,654,238 A | 8/1997 | Cronin et al. | |
| 5,669,303 A | 9/1997 | Maracas et al. | |
| 5,670,415 A | 9/1997 | Rust | |
| 5,700,626 A | 12/1997 | Lee et al. | |
| 5,723,176 A | 3/1998 | Keyworth et al. | |
| 5,724,145 A | 3/1998 | Kondo et al. | |
| 5,725,788 A | 3/1998 | Maracas et al. | |
| 5,736,424 A | 4/1998 | Prybyla et al. | |
| 5,743,998 A | 4/1998 | Park | |
| 5,747,102 A | 5/1998 | Smith et al. | |
| 5,753,014 A | 5/1998 | Van Rijn | |
| 5,760,500 A | 6/1998 | Kondo et al. | |
| 5,772,905 A | 6/1998 | Chou | |
| 5,776,748 A | 7/1998 | Singhvi et al. | |
| 5,779,799 A | 7/1998 | Davis | |
| 5,802,914 A | 9/1998 | Fassler et al. | |
| 5,820,769 A | 10/1998 | Chou | |
| 5,837,314 A | 11/1998 | Beaton et al. | |
| 5,849,209 A | 12/1998 | Kindt-Larsen et al. | |
| 5,849,222 A | 12/1998 | Jen et al. | |
| 5,855,686 A | 1/1999 | Rust | |
| 5,861,467 A | 1/1999 | Bujanowski et al. | |
| 5,877,036 A | 3/1999 | Kawai | |
| 5,877,861 A | 3/1999 | Ausschnitt et al. | |
| 5,888,650 A | 3/1999 | Calhoun et al. | |
| 5,895,263 A | 4/1999 | Carter et al. | |
| 5,900,160 A | 5/1999 | Whitesides et al. | |
| 5,905,104 A | 5/1999 | Eklund et al. | |
| 5,907,782 A | 5/1999 | Wu | |
| 5,912,049 A | 6/1999 | Shirley | |
| 5,926,690 A | 7/1999 | Toprac et al. | |
| 5,937,758 A | 8/1999 | Maracas et al. | |
| 5,942,871 A | 8/1999 | Lee | |
| 5,948,219 A | 9/1999 | Rohner | |
| 5,948,470 A | 9/1999 | Harrison et al. | |
| 5,948,570 A | 9/1999 | Kornblit et al. | |
| 5,952,127 A | 9/1999 | Yamanaka | |
| 5,956,216 A | 9/1999 | Chou | |
| 6,015,609 A * | 1/2000 | Chaouk et al. | 428/308.4 |
| 6,033,977 A | 3/2000 | Gutsche et al. | |
| 6,035,805 A | 3/2000 | Rust | |
| 6,038,280 A | 3/2000 | Rossiger et al. | |
| 6,039,897 A | 3/2000 | Lockhead et al. | |
| 6,046,056 A | 4/2000 | Parce et al. | |
| 6,051,345 A | 4/2000 | Huang | |
| 6,060,530 A * | 5/2000 | Chaouk et al. | 521/64 |
| 6,066,269 A | 5/2000 | Wei et al. | |
| 6,074,827 A | 6/2000 | Nelson et al. | |
| 6,091,485 A | 7/2000 | Li et al. | |
| 6,096,655 A | 8/2000 | Lee et al. | |
| 6,114,404 A | 9/2000 | Deeken et al. | |
| 6,117,708 A | 9/2000 | Wensel | |
| 6,125,183 A | 9/2000 | Jiawook et al. | |
| 6,128,085 A | 10/2000 | Buermann et al. | |
| 6,132,632 A | 10/2000 | Haney et al. | |
| 6,143,412 A | 11/2000 | Schueller et al. | |
| 6,146,811 A | 11/2000 | Kim et al. | |
| 6,150,231 A | 11/2000 | Muller et al. | |
| 6,150,680 A | 11/2000 | Eastman et al. | |
| 6,160,030 A * | 12/2000 | Chaouk et al. | 521/145 |
| 6,168,845 B1 | 1/2001 | Fontana, Jr. et al. | |
| 6,174,931 B1 | 1/2001 | Moon et al. | |
| 6,174,932 B1 * | 1/2001 | Pachl et al. | 522/100 |
| 6,180,239 B1 | 1/2001 | Whitesides et al. | |
| 6,188,150 B1 | 2/2001 | Spence | |
| 6,190,929 B1 | 2/2001 | Wang et al. | |
| 6,204,343 B1 | 3/2001 | Barucha et al. | |
| 6,204,922 B1 | 3/2001 | Chalmers | |
| 6,218,316 B1 | 4/2001 | Marsh | |
| 6,225,367 B1 * | 5/2001 | Chaouk et al. | 521/149 |
| 6,245,581 B1 | 6/2001 | Bonser et al. | |
| 6,274,294 B1 | 8/2001 | Hines | |
| 6,309,580 B1 | 10/2001 | Chou | |
| 6,316,290 B1 | 11/2001 | Wensel | |
| 6,326,627 B1 | 12/2001 | Putvinski et al. | |
| 6,329,256 B1 | 12/2001 | Ibok | |
| 6,334,960 B1 | 1/2002 | Willson et al. | |
| 6,335,149 B1 | 1/2002 | Xu et al. | |
| 6,342,097 B1 | 1/2002 | Terry et al. | |

| | | |
|---|---|---|
| 6,344,105 B1 | 2/2002 | Daugherty et al. |
| 6,355,198 B1 | 3/2002 | Kim et al. |
| 6,383,928 B1 | 5/2002 | Eissa |
| 6,387,783 B1 | 5/2002 | Furukawa et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,411,010 B1 | 6/2002 | Suzuki et al. |
| 6,447,919 B1 | 9/2002 | Brown et al. |
| 6,455,411 B1 | 9/2002 | Jiang et al. |
| 6,467,761 B1 | 10/2002 | Amatucci et al. |
| 6,468,642 B1 | 10/2002 | Bray et al. |
| 6,468,896 B2 | 10/2002 | Rohr et al. |
| 6,475,704 B1 | 11/2002 | Iwasaki et al. |
| 6,482,742 B1 | 11/2002 | Chou |
| 6,489,068 B1 | 12/2002 | Kye |
| 6,495,624 B1 | 12/2002 | Brown |
| 6,503,914 B1 | 1/2003 | Benish et al. |
| 6,514,672 B2 | 2/2003 | Tsai et al. |
| 6,517,995 B1 | 2/2003 | Jacobenson et al. |
| 6,518,168 B1 | 2/2003 | Clem et al. |
| 6,518,189 B1 | 2/2003 | Chou |
| 6,534,418 B1 | 3/2003 | Plat et al. |
| 6,541,356 B2 | 4/2003 | Fogel et al. |
| 6,541,360 B1 | 4/2003 | Plat et al. |
| 6,544,594 B2 | 4/2003 | Linford et al. |
| 6,561,706 B2 | 5/2003 | Singh et al. |
| 6,565,776 B1 | 5/2003 | Li et al. |
| 6,565,928 B2 | 5/2003 | Sakamoto et al. |
| 6,580,172 B2 | 6/2003 | Mancini et al. |
| 6,583,248 B1 | 6/2003 | Bowen |
| 6,600,207 B2 | 7/2003 | Huang et al. |
| 6,632,742 B2 | 10/2003 | Yang et al. |
| 6,635,581 B2 | 10/2003 | Wong |
| 6,646,662 B1 | 11/2003 | Nebashi et al. |
| 6,649,272 B2 | 11/2003 | Moore et al. |
| 6,664,306 B2 | 12/2003 | Gaddam et al. |
| 6,677,252 B2 | 1/2004 | Marsh |
| 6,696,157 B1 | 2/2004 | David et al. |
| 6,696,220 B2 | 2/2004 | Bailey et al. |
| 6,703,190 B2 | 3/2004 | Elian |
| 6,713,238 B1 | 3/2004 | Chou et al. |
| 6,716,767 B2 | 4/2004 | Shih et al. |
| 6,719,915 B2 | 4/2004 | Willson et al. |
| 6,721,529 B2 | 4/2004 | Chen et al. |
| 6,730,256 B1 | 5/2004 | Bloomstein et al. |
| 6,737,202 B2 | 5/2004 | Gehoski et al. |
| 6,737,489 B2 | 5/2004 | Linert et al. |
| 6,743,713 B2 | 6/2004 | Mukherjee-Roy et al. |
| 6,767,983 B1 | 7/2004 | Fujiyama et al. |
| 6,770,852 B1 | 8/2004 | Steger |
| 6,774,183 B1 | 8/2004 | Palumbo et al. |
| 6,776,094 B1 | 8/2004 | Whitesides et al. |
| 6,777,170 B1 | 8/2004 | Bloomstein et al. |
| 6,790,905 B2 | 9/2004 | Fitzgerald et al. |
| 6,802,870 B2 | 10/2004 | Chang et al. |
| 6,809,356 B2 | 10/2004 | Chou |
| 6,828,244 B2 | 12/2004 | Chou |
| 6,830,819 B2 | 12/2004 | Kaplan et al. |
| 6,849,558 B2 | 2/2005 | Schaper |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,932,934 B2 | 8/2005 | Choi et al. |
| 6,936,194 B2 | 8/2005 | Watts |
| 2001/0044075 A1 | 11/2001 | Nishimura et al. |
| 2002/0042027 A1 | 4/2002 | Chou et al. |
| 2002/0072009 A1 | 6/2002 | Kim et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0132482 A1 | 9/2002 | Chou |
| 2002/0135099 A1 | 9/2002 | Robinson et al. |
| 2002/0146642 A1 | 10/2002 | Kim et al. |
| 2002/0150398 A1 | 10/2002 | Choi et al. |
| 2002/0167117 A1 | 11/2002 | Chou |
| 2002/0177319 A1 | 11/2002 | Chou |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0113638 A1 | 6/2003 | Mancini et al. |
| 2003/0129542 A1 | 7/2003 | Shih et al. |
| 2003/0166814 A1 | 9/2003 | Sparrowe et al. |
| 2003/0205657 A1 | 11/2003 | Voisin |
| 2003/0205658 A1 | 11/2003 | Voisin |
| 2003/0215577 A1 | 11/2003 | Willson et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0010341 A1 | 1/2004 | Watts et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0053146 A1 | 3/2004 | Sreenivasan et al. |
| 2004/0065252 A1 | 4/2004 | Sreenivasan et al. |
| 2004/0086793 A1 | 5/2004 | Sreenivasan et al. |
| 2004/0089979 A1 | 5/2004 | Rubin |
| 2004/0090611 A1 | 5/2004 | Choi et al. |
| 2004/0104641 A1 | 6/2004 | Choi et al. |
| 2004/0110856 A1 | 6/2004 | Young et al. |
| 2004/0112861 A1 | 6/2004 | Choi et al. |
| 2004/0112862 A1 | 6/2004 | Willson et al. |
| 2004/0116548 A1 | 6/2004 | Willson et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0141163 A1 | 7/2004 | Bailey et al. |
| 2004/0141168 A1 | 7/2004 | Sreenivasan et al. |
| 2004/0149687 A1 | 8/2004 | Choi et al. |
| 2004/0156108 A1 | 8/2004 | Chou et al. |
| 2004/0163563 A1 | 8/2004 | Sreenivasan et al. |
| 2004/0168586 A1 | 9/2004 | Bailey et al. |
| 2004/0168588 A1 | 9/2004 | Choi et al. |
| 2004/0168613 A1 | 9/2004 | Nguyen |
| 2004/0169441 A1 | 9/2004 | Choi et al. |
| 2004/0170770 A1 | 9/2004 | Nguyen |
| 2004/0170771 A1 | 9/2004 | Bailey et al. |
| 2004/0188381 A1 | 9/2004 | Sreenivasan et al. |
| 2004/0189994 A1 | 9/2004 | Sreenivasan et al. |
| 2004/0189996 A1 | 9/2004 | Sreenivasan et al. |
| 2004/0192041 A1 | 9/2004 | Jeong et al. |
| 2004/0197843 A1 | 10/2004 | Chou et al. |
| 2004/0200411 A1 | 10/2004 | Willson et al. |
| 2004/0202865 A1 | 10/2004 | Homola et al. |
| 2004/0202872 A1 | 10/2004 | Fang et al. |
| 2004/0209177 A1 | 10/2004 | Sreenivasan et al. |
| 2004/0241338 A1 | 12/2004 | Foster et al. |
| 2004/0250945 A1 | 12/2004 | Zheng et al. |
| 2005/0037143 A1 | 2/2005 | Chou et al. |
| 2005/0051698 A1 | 3/2005 | Sreenivasan et al. |
| 2005/0084804 A1 | 4/2005 | Truskett et al. |
| 2005/0100830 A1 | 5/2005 | Xu et al. |
| 2005/0118749 A1 | 6/2005 | Sakamoto et al. |
| 2005/0156357 A1 | 7/2005 | Willson et al. |
| 2005/0160934 A1 | 7/2005 | Xu et al. |
| 2006/0111454 A1 | 5/2006 | Xu et al. |

FOREIGN PATENT DOCUMENTS

| | | |
|---|---|---|
| DE | 19648844 | 9/1997 |
| EP | 244884 | 3/1987 |
| EP | 733455 | 9/1996 |
| EP | 1342736 A2 | 10/2003 |
| EP | 1491356 A2 | 12/2004 |
| JP | 55-88332 | 7/1980 |
| JP | 57-7931 | 1/1982 |
| JP | 61-40845 | 2/1986 |
| JP | 63-138730 | 6/1988 |
| JP | 1-196749 | 8/1989 |
| JP | 02-24848 | 1/1990 |
| JP | 02-92603 | 4/1990 |
| JP | 02192045 | 7/1990 |

| | | |
|---|---|---|
| JP | 2-248480 | 10/1990 |
| JP | 3-90345 | 4/1991 |
| JP | 9-278490 | 10/1997 |
| WO | WO 87/02935 | 5/1987 |
| WO | WO 92/17883 | 10/1992 |
| WO | WO 98/10121 | 3/1998 |
| WO | WO 99/05724 | 2/1999 |
| WO | WO 99/45753 | 9/1999 |
| WO | WO 99/63535 | 12/1999 |
| WO | WO 00/21689 | 4/2000 |
| WO | 0046035 A1 | 8/2000 |
| WO | 0054107 A1 | 9/2000 |
| WO | WO 00/54107 | 9/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/69317 | 9/2001 |
| WO | WO 01/79589 | 10/2001 |
| WO | WO 01/79592 | 10/2001 |
| WO | WO 01/90816 | 11/2001 |
| WO | WO 02/07199 | 1/2002 |
| WO | 02069040 A | 9/2002 |
| WO | WO 03/010289 | 2/2003 |
| WO | 03073164 A2 | 9/2003 |
| WO | WO 03/079416 | 9/2003 |
| WO | WO 03/099536 | 12/2003 |
| WO | WO 2004/044651 | 5/2004 |
| WO | 2004061526 A | 7/2004 |
| WO | WO 2004/114016 | 12/2004 |

OTHER PUBLICATIONS

Abstract of Japanese Patent 02-92603, Aug. 12, 2004.
Abstract of Japanese Patent 55-88332, Apr. 14, 2004.
Abstract of Japanese Patent 57-7931, Apr. 14, 2004.
Abstract of Japanese Patent 63-138730, Apr. 14, 2004.
Ananthasuresh et al., "Strategies for Systematic Synthesis of Compliant Mems.", DSC-vol. 55-2, Dynamic Systems and Control: vol. 2, pp. 677-686, Nov. 1, 1994.
Arai et al., "Calibration and Basic Motion of Micro Hand Module.", IEEE, Jan. 1. 1993, pp. 1660-1665.
Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145-149.
Bailey et al., "Imprint Lithography Templates having Alignment Marks," U.S. Appl. No. 10/666,527, Filed with USPTO Sep. 18, 2003.
Bender et al., "Fabrication of Nanostructures using a UV-based Imprint Technique.", Microelectronic Engineering 53, Jan. 1, 2000, pp. 233-236.
Cherala et al., "Applying Imprinting Material to Substrates Employing Electromagnetic Fields," U.S. Appl. No. 10/687,562, Filed with USPTO Oct. 16, 2003.
Sreenivasan et al., "A Conforming Template for Patterning Liquids Disposed on Substrates." U.S. Appl. No. 10/614,716, Filed with USPTO on Jul. 7, 2003.
Choi et al., "Design of Orientation Stages for Step and Flash Imprint Lithography.", Precision Engineering, Jan. 1, 2001, pp. 192-199.
Chou et al., "Imprint Lithography with 25-Nanometer Resolution", Science, Apr. 5, 1996, pp. 85-87, vol. 272.
Chou et al., "Imprint Lithography with Sub-10nm Feature Size and High Throughput", Microelectronic Engineering, 1997, pp. 237-240, vol. 35.
Chou et al., "Imprint of Sub-25 nm Vias and Trenches in Polymers", Applied Physics Letters, Nov. 20, 1995, pp. 3114-3116, vol. 67(21).
Chou et al., "Lithographically Induced Self-assembly of Periodic Polymer Micropillar Arrays.", J. Vac. Sci. Technol., Nov. 1, 1999, B 17(6), pp. 3197-3202.
Chou et al., "Nanoimprint Lithography and Lithographically Induced Self-Assembly.", MRS Bulletin, Jul. 1, 2001, pp. 512-517.
Cowie, "Polymers: Chemistry and Physics of Modem Materials.", $2^{nd}$ Ed., Jan. 1, 1991, pp. 408-409.

Feldman et al., "Wafer Chuck Magnification Correction in X-Ray Lithography.", J. Vac. Sci. Technol. B 16(6), Nov. 1, 1998, pp. 3476-3479.
Gokan et al., "Dry Etch Resistance of Organic Materials.", J. Electrochem. Soc.: Solid-State Science and Technology, Jan. 1, 1983, pp. 143-146.
Goldfarb et al., "Compliant Micromanipulator Design for Scaled Bilateral Telemanipulation of Small-Scale Environments.", ASME International Mechanical Engineering Conference and Exposition, Nov. 1, 1998, DSC-vol. 64, pp. 213-218.
Haisma et al., "Mold-assisted Nanolithography: A Process for Reliable Pattern Replication.", J. Vac. Sci. Technol. B, Nov. 1, 1996, pp. 4124-4128.
Hashimoto et al., "Design and Characteristics of a Parallel Link Complaint Wrist." IEEE, May 1, 1994, Department of Mechanical Engineering, Kagoshiam University, pp. 2457-2462.
Heidari, "Nanoimprint Lithography at the 6 in. Wafer Scale.", J. Vac. Sci. Technol. B 18 (6), Nov. 1, 2000, pp. 3557-3560.
Hexel Coporation. "Tornado 2000 System Specifications.", www.hexel.com, Nov. 12, 1999.
Hirai et al., "Mold Surface Treatment for Imprint Lithography.", Journal of Photopolymer Science and Technology, Aug. 1, 2001. vol. 14, No. 3, pp. 457-462.
Hogan et al., "Impedance Control: An Approach to Manipulation: Part 1—Theory.", Journal of Dynamic Systems, Measurement, and Control, Mar. 1, 1985, vol. 107, pp. 1-7.
Hollis et al., "A Six-Degree-of-Freedom Magnetically Levitated Variable Compliance Fine-Motion Wrist: Design, Modeling, and Control.", IEEE Transactions on Robotics and Automation, Jun. 1, 1991, vol. 7., No. 3, pp. 320-332.
Howell et al., "A Loop-Closure Theory for the Analysis and Synthesis of Compliant Mechanisms.", Journal of Mechanical Design, Mar. 1, 1996, vol. 188, pp. 121-125.
Hu et al., "Fluorescence Probe Techniques (FPT) for Measuring the Relative Efficiencies of Free Radical Photoinitiatiors.", Macromolecules, May 29, 1998, 31, pp. 4107-4113.
Johnson et al., "Advances in Step and Flash Imprint Lithography.", SPIE Microlithography Conference, Feb. 23, 2003.
Kanetomo et al., "Robot for Use in Ultrahigh Vacuum.", Solid State Technology, Aug. 1, 1997, pp. 63-72.
Kim et al., "Surface Energy and Polarity of Treated Indium-Tin-Oxide Anodes for Polymer Light-Emittng Diodes Studied by Contact Angle Measurements." Journal of Applied Physics 1999, pp. 2774-2778, vol. 86, No. 5.
Kim et al., "High-precision Magnetic Levitation Stage for Photolithography.", Precision Engineering, Apr. 1, 1998, vol. 22., No. 2, pp. 66-77.
Koseki, "Design and Accuracy Evaluation of High-Speed and High Precision Parallel Mechanism.", Proc. of IEEE, Jan. 1, 1998, Intl. Conf. on Robotics & Automation, pp. 1340-1345.
Kotachi et al., "Si-Containing Positive Resist for ArF Excimer Laser Lithography.", Photopolymer of Science and Technology, Nov. 4, 1995, pp. 615-622.
Krauss et al., "Fabrication of Nanodevices Using Sub-25 nm Imprint Lithography.", Appl. Phy. Lett., Jan. 1, 1995, 67(21), pp. 3114-3116.
Krug et al., "Fine Patterning of Thin Sot-gel Films.", Journal of Non-Crystalline Solids, Jan. 1, 1992, 147 & 148, pp. 447-450.
Lee et al., "An Ultraprecision Stage for Alignment of Wafers in Advanced Microlithography.", Precision Engineering, Sep. 1, 1997, pp. 113-122.
Lee et al., "Ultra Precision Positioning System for Servo Motor-piezo Actuator Using the Dual Servo Loop and Digital filter Implementation.", American Society for Precision Engineering, Jan. 1, 1998, pp. 287-290.
Lin, "Multi-Layer Resist Systems.", Introduction to Microlithography, Feb. 14, 1983, pp. 287-349.
Lucas Aerospace, Free-Flex ® Pivot Catalog, Jan. 1, 1999.
Mansky et al., "Large-Area Domain Alignment in Block Copolymer Thin Films Using Electric Fields.", Macromolecules, Jun. 9, 1998, vol. 31, No. 13, pp. 4399-4401.
McMackin et al., "A Method of Creating a Turbulent Flow of Fluid between a Mold and a Substrate," U.S. Appl. No. 10/898,034, Filed with USPTO Jul. 23, 2004.

McMackin et al., "A System of Creating a Turbulent Flow of Fluid between a Mold and a Substrate," U.S. Appl. No. 10/898,037, Filed with USPTO Jul. 23, 2004.

McMackin et al., Single Phase Fluid Imprint Lithography Method, U.S. Appl. No. 10/677,639, Filed with USPTO Oct. 16, 2003.

Merlet, "Parallel Manipulators: State of the Art and Perspectives.", Advanced Robotics, Jan. 1, 1994, vol. 8, pp. 589-596.

Mirkin et al., "Emerging Methods for Micro-and-Nanofabrication.", MRS Bulletin, Jul. 1, 2001, pp. 506-509.

Mittal, "Precision Motion Control of a Magnetic Suspension Actuator Using a Robust Nonlinear Compensation Scheme.", IEE/ASME Transactions on Mechatronics., Dec. 1, 1997, vol. 2., No. 4, pp. 268-280.

Nerac.Com Retro Search, "Multi-Layer Resists.", Sep. 2, 2004.

Nerac.Com Retro Search, "Reduction of Dimension of Contact Holes.", Aug. 31, 2004.

Nerac.Com Retro Search, "Trim Etching of Features Formed on an Organic Layer.", Sep. 2, 2004.

Nguyen, "Asymmetric Fluid-Structure Dynamics in Nanoscale Imprint Lithography." The University of Texas at Austin, Aug. 1, 2001, pp. 1-11.

Ohya et al., "Development of 3-DOF Finger Module for Micro Manipulation.", Proc. of IEEE, Mar. 1, 1999, Intl. Conf. on Intelligent Robots and Systems, pp. 894-899.

Otto et al., "Step and Repeat UV-Nanoimprint Lithography: Material Issues.", NNTO2 San Francisco, Dec. 11, 2002.

Papirer et al., "Abstract of the Grafting of Perfluorinated Silanes onto the Surface of Silica: Characterization by Inverse Gas Chromatography.", Journal of Colloid and Interface Science 159, Aug. 1, 1993, pp. 238-242.

Parikh et al., "An Intrinsic Relationship between Molecular Structure in Self-Assembled n-Alkylsiloxane Monolayers and Deposition Temperature.", Journal of Phys. Chem., Jul. 1, 1994, pp. 7577-7590.

Paros et al., "How to design Flexure Hinges.", Machine Design, Nov. 25, 1965, pp. 151-156.

Peng et al., "Compliant Motion Control of Kinematically Redundant Manipulators.", IEEE Transactions on Robotics and Automation, Dec. 1, 1993, vol. 9, No. 6, pp. 831-837.

Pernette et al., "Design of Parallel Robots in Microbotics.", Robotica, Jan. 1, 1997, vol. 15, pp. 417-420.

Physik Instruments, PI Online-Catalog, 1999 from www.physikinstruments.com.

Physik Instruments, Product Catalog for Micropositioning, 1997.

Raibert et al., "Hybrid Position/Force Control of Manipulators.", Journal of Dynamic Systems, Measurement, and Control, Jun. 1, 1981, vol. 102, pp. 126-133.

Rong et al., "Design and Analysis of Flexure-Hinge Mechanism Used in Micro-Positioning Stages.", ASME, Jan. 1, 1994, vol. 2, pp. 979-985.

Rong et al., "Dynamics of Parallel Mechanism with Direct Compliance Control.", IEEE, Jan. 1, 1997, pp. 1753-1758.

Roos et al., "Nanoimprint Lithography with a Commercial 4 Inch Bond System for Hot Embossing.", Proceedings of SPIE, Oct. 1, 2001, vol. 4343, pp. 427-435.

Sagiv, "Organized Monolayers by Absorption. 1. Formation and Structure of Oleophobic Mixed Monolayers on Solid Surfaces.", Journal of American Cheinical Society/102:1, Jan. 2, 1980.

Scheer et al., "Problems of the Nanoimprinting Technique for Nanometer Scale Pattern Definition.", J. Vac. Sci. Techno. B., Nov. 1, 1998, pp. 3917-3921.

Slocum, "Precision Machine Design: Macromachine Design Philosophy and Its Applicability to the Design of Micromachines.", Micro Electro Mechanical Systems, Feb. 4, 1992.

Sowah, Diamond Used to Break the Mould [online], Sep. 18, 2002, [Retrieved on Sep. 2, 2003.] Retrieved from the Internet: <URL: http: Http://eetuk.com/showArticle.jhtml?articleID=19203691>.

Sreenivasan et al., "An Imprint Lithography System to Produce a Light to Impinge upon and Polymerize a Liquid in Superimposition with Template Overlay Marks," U.S. Appl. No. 10/864,214, Filed with USPTO Jun. 9, 2004.

Srinivasan et al., "Alkyltrichlorosilane-Based Self-Assembled Monolayer Films for Stiction Reduction in Silicon Micromachines.", Journal of Microelectromechanical Systems, Jun. 1, 1998, vol. 7, No. 2, p. 252-260.

Stewart, "A Platform With Six Degrees of Freedom.", Proc Instn Mech Engrs, May 28, 1965, vol. 180, Pt1, No. 15, pp. 371-378.

Sung et al., "Abstract of Micro/nano-tribological Characteristics of Self-Assembled Monolayer and its Application in Nano-Structure Fabrication", Elsevier Science B.V., Jul. 1, 2003, vol. 255, No. 7.

Sung et al., "Micro/nano-tribological Characteristics of Self-Assembled Monolayer and its Application in Nano-Structure Fabrication.", Elsevier Science B.V., Jul. 1, 2003, vol. 255, No. 7, pp. 808-818.

Tajbakhsh et al., "Three-Degree-of-Freedom Optic.Mount for Extreme Ultraviolet.", American Society for Precision Engineering, Jan. 1, 1998, pp. 359-362.

Tanikawa et al., "Development of Small-sized 3 DOF Finger Module in Micro Hand for Micro Manipulation.", Proc. of IEEE, Mar. 1, 1999, Intl. conf. on Intelligent Robots and Systems, pp. 876-881.

Translation of Japanese Patent 02-24848, Jan. 26, 1990.

Translation of Japanese Patent 02-92603, Apr. 3, 1990.

Trilogy Systems, "Linear Motors 310.", wwww.trilogysystems.com, Jan. 1, 2001.

Vanderbilt University Office of Transfer Technology; VU9730 Specifications for Improved Flexure Device; 2001, 25, 192-199.

Wang et al., "Passive Compliance versus Active Compliance in Robot-Based Automated Assembly Systems.", Industrial Robot, Jan. 1, 1998, vol. 25, No. 1, pp. 48-57.

Williams et al., "Six Degree of Freedom Mag-Lev Stage Development.", SPIE, Jan. 1, 1997, vol. 3051, pp. 856-867.

Wu, "Large Area High Density Quantized Magnetic Disks Fabricated Using Nanoimprint Lithography.", J. Vac. Sci. Technol., Nov. 1, 1998, B 16(6), pp. 3825-3829.

Xia et al., "Soft Lithography,", Annu Rev. Mater Sci. 1998 28: 153-184.

Xia et al., "Soft Lithography.", Angew. Chem. Int. Ed., Jan. 1, 1998, pp. 551-575.

Chou, Ultrafast and Direct Imprint of Nanostructures in Silicon, Nature, col. 417, (Jun. 2002), pp. 835-837.

Blomquist et al., Fluorinated Acrylates in making Low-Loss, Low-Birefringence, and Single-Mode Optical Waveguides with Exceptional Thermo-Optic Properties, SPIE Conference on Linear Optical Properties of Waveguides and Fibers, vol. 3799, pp. 266-279 Jul. 1, 1999.

Eldada et al, Robust Photopolymers for MCM, Board, and Backplane Optical Interconnects, SPIE vol. 3288, pp. 175-191 Jan. 1, 1998.

Eldada et al., Affordable WDM Components: The Polymer Solution, SPIE vol. 3234, pp. 161-174 Jan. 1, 1998.

Eldada et al., Advanced Polymer Systems for Optoelectronic Integrated Circuit Applications, SPIE vol. 3006, pp. 344-361 Jan. 1, 1997.

Hirai et al., Abstract of Mold Surface Treatment for Imprint Lithography, Journal of Photopolymer Science and Technology, pp. 457-462, vol. 14, No. 3 Aug. 1, 2001.

Roos et al., Abstract of Nanoimprint Lithography with a Commercial 4 Inch Bond System for Hot Embossing, Proceedings of SPIE vol. 4343, pp. 427-435 Oct. 1, 2001.

Sol-Gel Technology, www.chemat.com/html/solgel.html Jan. 14, 2004.

Sol-Gel Chemistry, www.prsc/usm.edu/mauritz/solgel.html Feb. 2, 2004.

Hakovirta et al., Optical Properties of Fluorinated Diamond-Like Carbon Films Produced by Pulsed Glow Discharge Plasma Immersion Ion Processing, Journal of Applied Physics 88(3); pp. 1456-1459 Aug. 4, 2000.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mii.org/Minerals/photosil Mar. 31, 2005.

Electronic Devices and Circuits, people.deas.harvard.edu/~jones/es154/lectures/lecture_2/materials/materials.html Mar. 31, 2005.

International Chemical Safety Card for p-Toluenseulfonic Acid, www.itcilo.it/english/actrav/teleam/osh/ic/104154.htm Dec. 5, 2003.

Data Sheet for Methyl Amyl Ketone, www.arb.ca.gov/db/solvents/solvent_pages/Ketones-HTML/methyl_amyl.htm Mar. 31, 2005.

Golden et al., Designing Porous Low-k Dielectrics, www.reed-electronics.com/semiconductor/index.asp?layout=articlePrint&articleID=CA82824 Apr. 6, 2005.

Padovani et al., Chemically Bonded Porogens in Methylsilsesquioxane: I. Structure and Bonding, Journal of the Electrochemical Society, 149 (12) F161-F170 Oct. 16, 2002.

Wolf et al., Silicon Processing for the VLSI Era, vol. 1—Process Technology, pp. 407-413 Jan. 1, 1986.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

Wolf et al., Silicon Processing for the VLSI Era, vol. 1—Process Technology, pp. 541, 542, 544, 564, 565 Jan. 1, 1986.

Novec Fluorosurfactant FC-4432, http://multimedia.mmm.com/mws/mediawebserver.dyn?333333SQa783cMj3wMj333wyXuFiiiiH-Aug. 4, 2005.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

Xu et al., Development of Imprint Material for the Step and Flash Imprint Lithography Process, SPIE Microlithography Conference Feb. 1, 2004.

Nordquist et al., Image Placement Issues for ITO-based Step and Flash Imprint Lithography Templates, J. Vac. Sci. Technol. B, pp. 695-701, Mar. 1, 2004.

Resnick et al., Release Layers for Contact and Imprint Lithography, Semiconductor International, pp. 71-80 Jun. 1, 2002.

U.S. Appl. No. 10/763,885, filed Jan. 23, 2004, Xu et al.

U.S. Appl. No. 11/012,374, filed Dec. 15, 2004, Xu et al.

U.S. Appl. No. 11/068,174, filed Feb. 28, 2005, Xu et al.

Colburn et al., Step and Flash Imprint Lithography for sub-100 nm Patterning, Proceedings of SPIE vol. 3997, pp. 453-457, Jan. 1, 2000.

Papirer et al., The Grafting of Perfluorinated Silanes onto the Surface of Silica: Characterization by Inverse Gas Chromatography, Journal of Colloid and Interface Science 159, pp. 238-242, Aug. 1, 1993.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Yu et al., Properties of Fluorinated Amorphous Diamond Like Carbon Films by PECVD, Applied Surface Science 219 (3-4); pp. 228-237, Dec. 1, 2003.

Compon et al., Electroanalysis at Diamond-Like and Doped-Diamond Electrodes, Electroanalysis 15(17); pp. 1349-1363, Sep. 1, 2003.

Mansano et al., Protective Carbon Layer for Chemical Corrosion of Stainless Steel, Diamond and Related Materials 12 (3-7); pp. 749-752, Mar. 1, 2003.

Butter et al., Production and Wetting Properties of Fluorinated Diamond-Like Carbon Coatings, Thin Solid Films, 311(1-2); pp. 107-113, Dec. 31, 1997.

Hakovirta et al., Heat Resistance of Fluorinated Diamond-Like Carbon Films, Diamond and Related Materiasl 10(8); pp. 1486-14911, Aug. 1, 2001.

Zhu et al., The Improvement of the Oxidation Resistance of TiAl Alloys by Fluorine Plasma-Based Ion Implantation, Surface and Coatings Technology 158; pp. 502-507, Sep. 1, 2002.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178, Apr. 17, 2004.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Bender et al., Multiple Imprinting in UV-based Nanoimprint Lithography: Related Material Issues, Microelectronic Engineering 61-62, pp. 407-413 Jan. 1, 2002.

U.S. Appl. No. 11/244,428, naming Inventors Xu et al., entitled Method of Providing Desirable Wetting and Release Characteristics Between a Mold an a Polymerizable Composition, filed Oct. 5, 2005.

Novec Fluorosurfacants for Paints and Coatings, Nov. 3, 2003.

Translation of Japanese Patent 61-40845, Feb. 1, 1986.

Translation of Japanese Patent 02-248480, Oct. 1, 1990.

Translation of Japanese Patent 03-090345, Apr. 1, 1991.

Translation of Japanese Patent 09-278490, Oct. 1, 1997.

Abstract of Japanese Patent 03-090345, Apr. 1, 1991.

Abstract of Japanese Patent 09-278490, Oct. 1, 1997.

Yoneda et al., Translation of Japanese Patent 02-248480, Transparent Substrate with Water-Repellent and Antistaining Properties, and Structure Equipped Therewith Oct. 4, 1990.

Yoneda et al., Translation of Japanese Patent 02-248480, Transparent Substrate Material with Water-Repllent and Anti-Staining Properties and Structure Equipped with Same Oct. 4, 1990.

* cited by examiner

MATERIALS FOR IMPRINT LITHOGRAPHY

TECHNICAL FIELD OF THE INVENTION

One or more embodiments of the present invention relate generally to imprint lithography. In particular, one or more embodiments of the present invention relate to materials for imprint lithography.

BACKGROUND OF THE INVENTION

Micro-fabrication involves the fabrication of very small structures, for example, and without limitation, structures having features on the order of micro-meters or smaller. One area in which micro-fabrication has had a sizeable impact is in processing of integrated circuits. As the semiconductor processing industry continues to strive for larger production yields while increasing the circuits per unit area formed on a substrate, micro-fabrication becomes increasingly important since micro-fabrication provides greater process control while allowing a reduction in the minimum feature dimension of the structures formed. Other areas of development in which micro-fabrication have been employed include biotechnology, optical technology, mechanical systems and the like.

An exemplary micro-fabrication technique is disclosed in U.S. Pat. No. 6,334,960 to Willson et al. In particular, the Willson et al. patent discloses a method of imprint lithography to form a relief pattern in a structure. The method includes providing a substrate having a transfer layer (typically spin-coated), and covering the transfer layer, in turn, with a low viscosity, polymerizable (typically UV curable) fluid composition (typically in the form of droplets). The method further includes mechanically contacting an imprint template or mold having a relief structure with the polymerizable fluid composition wherein the polymerizable fluid composition fills a gap between the imprint template and the substrate and fills the relief structure of the imprint template. Next, the method includes subjecting the polymerizable fluid composition to conditions to solidify and to polymerize the same (typically, exposing the polymerizable fluid composition to UV to crosslink it), thereby forming a solidified polymeric material on the transfer layer that contains a relief structure complimentary to that of the imprint template. Next, the method includes separating the imprint template from the substrate to leave solid polymeric material on the substrate, which solid polymeric material includes a relief pattern in the form of the complimentary relief structure. Next, the solidified polymeric material and the transfer layer are subjected to an environment to selectively etch the transfer layer relative to the solidified polymeric material to form a relief image in the transfer layer.

The following issues that relate to selective adhesion of the solidified polymeric material to different surfaces are typically considered when one develops a method and/or a material useful in forming fine-feature relief patterns in the solidified polymeric material. First, the solidified polymeric material ought to adhere well to the transfer layer on the substrate, and second, it ought to be easily released from the surface of the imprint template. These issues are typically referred to as release characteristics, and if they are satisfied, the relief pattern recorded in the solidified polymeric material will not be distorted during separation of the imprint template from the substrate.

In addition to the above-described release characteristics, when designing an imprinting material for use in imprint lithography, further considerations include: (a) low viscosity, for example, and without limitation, a viscosity, at 25° C., of 5 centipoise or less, to fast spread over both the substrate and the surface of the imprint template, and to fast fill the imprinting material into the relief pattern. It is better if the viscosity is sufficiently low so that minimal pressure, for example, and without limitation, a pressure of about 2-4 psi, and no additional heating are necessary to move the imprinting material into the relief pattern on the imprint template; (b) low vapor pressure so that there is little evaporation (evaporation is a problem since the droplets of imprinting material may be on the order of 80 pico-liters, and this results in droplets having a large ratio between surface area and volume); and (c) cohesive strength of the cured imprinting material.

In light of the above, there is a need for imprinting materials for use in imprint lithography that satisfy one or more of the above-identified design criteria.

SUMMARY OF THE INVENTION

The present invention is directed to a material for use in imprint lithography that features a composition having a viscosity associated therewith and including a surfactant, a polymerizable component, and an initiator responsive to a stimuli to vary the viscosity in response thereto, with the composition, in a liquid state, having the viscosity being lower than about 100 centipoises, a vapor pressure of less than about 20 Torr, and in a solid cured state a tensile modulus of greater than about 100 MPa, a break stress of greater than about 3 MPa and an elongation at break of greater than about 2%.

DETAILED DESCRIPTION OF THE INVENTION

Figure 1:
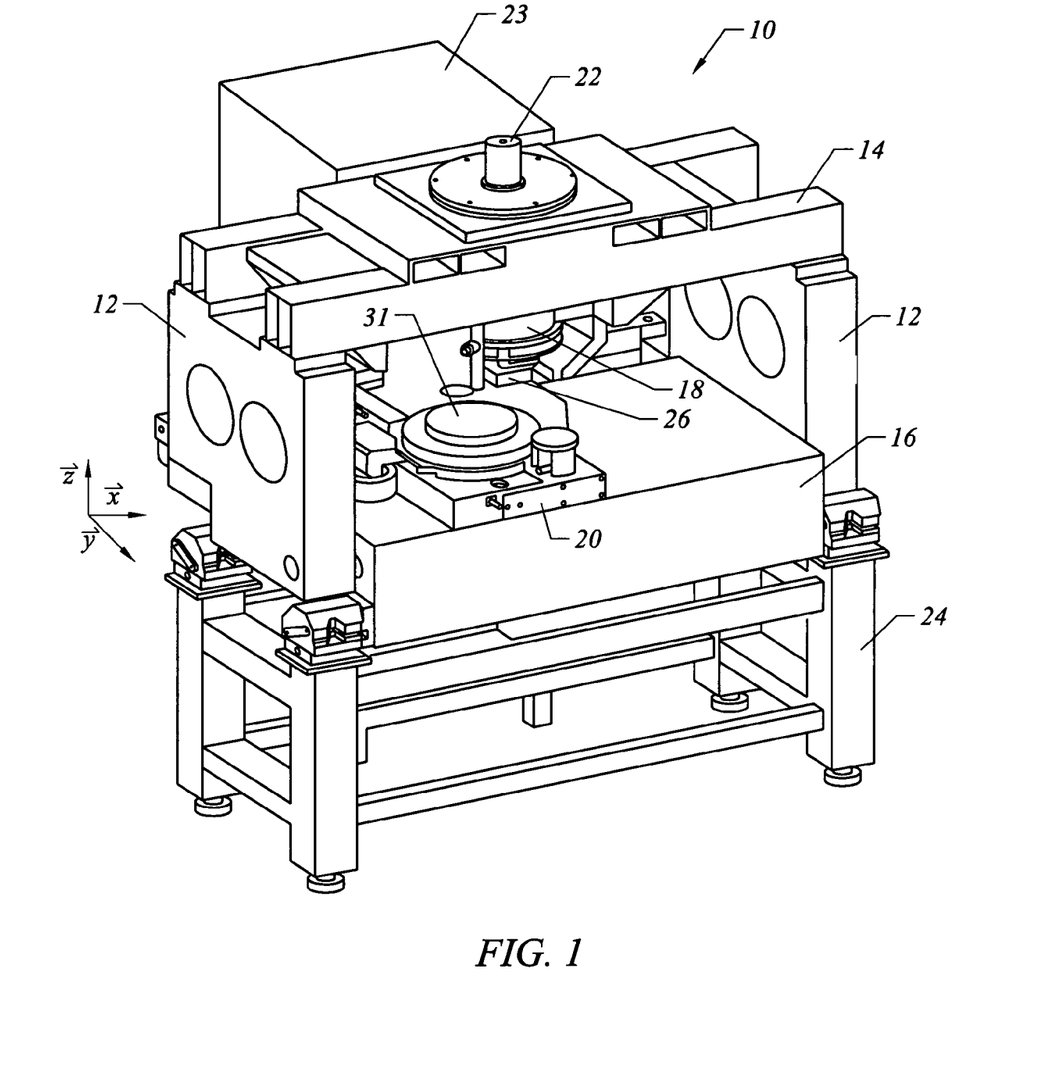
FIG. 1 is a perspective view of a lithographic system useful in carrying out one or more embodiments of the present invention.

FIG. 1 shows the lithographic system 10 that may be used to carry out imprint lithography in accordance with one or more embodiments of the present invention and that may utilize imprinting materials fabricated in accordance with one or more embodiments of the present invention. As shown in FIG. 1, system 10 includes a pair of spaced-apart bridge supports 12 having bridge 14 and stage support 16 extending therebetween. As further shown in FIG. 1, bridge 14 and stage support 16 are spaced-apart. Imprint head 18 is coupled to bridge 14, and extends from bridge 14 toward stage support 16. Motion stage 20 is disposed upon stage support 16 to face imprint head 18, and motion stage 20 is configured to move with respect to stage support 16 along X- and Y-axes. Radiation source 22 is coupled to system 10 to impinge actinic radiation upon motion stage 20. As further shown in FIG. 1, radiation source 22 is coupled to bridge 14, and includes power generator 23 connected to radiation source 22. An exemplary system is available under the trade name IMPRIO 100™ from Molecular Imprints, Inc. having a place of business at 1807-C Braker Lane, Suite 100, Austin, Tex. 78758. The system description for the IMPRIO 100™ is available at www.molecularimprints.com and is incorporated herein by reference.

Figure 2:
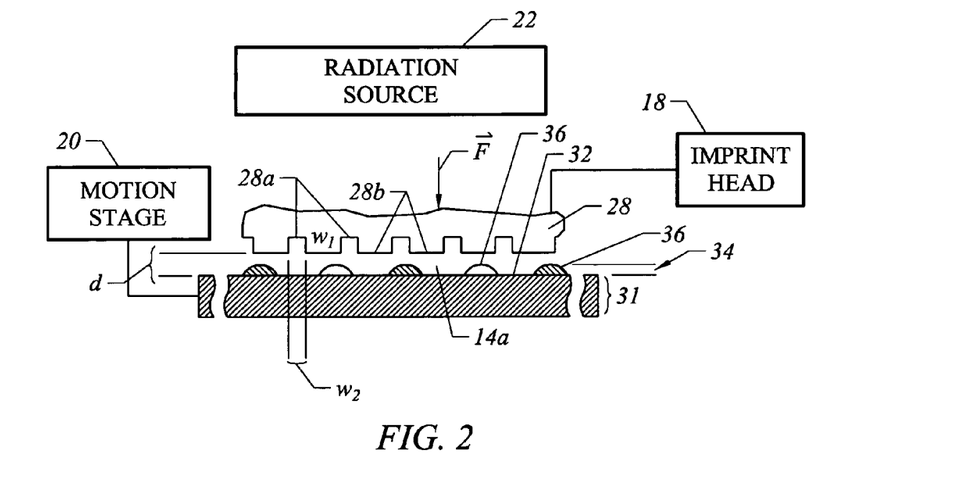
FIG. 2 is a simplified elevation view of a lithographic system shown in FIG. 1.

Referring to FIGS. 1 and 2, connected to imprint head 18 is imprint template 26 having mold 28 thereon. Mold 28 includes a plurality of features defined by a plurality of spaced-apart recessions 28a and protrusions 28b. The plurality of features defines an original pattern that is to be transferred into substrate 31 positioned on motion stage 20. Substrate 31 may comprise a bare wafer or a wafer with one or more layers disposed thereon. To that end, imprint head 18 is adapted to move along the Z-axis and vary a distance "d" between mold 28 and substrate 31. In this manner, features on mold 28 may be imprinted into a conformable region of substrate 31, discussed more fully below. Radiation source 22 is located so that mold 28 is positioned between radiation source 22 and substrate 31. As a result, mold 28 is fabricated from material that allows it to be substantially transparent to the radiation produced by radiation source 22.

Figure 3:
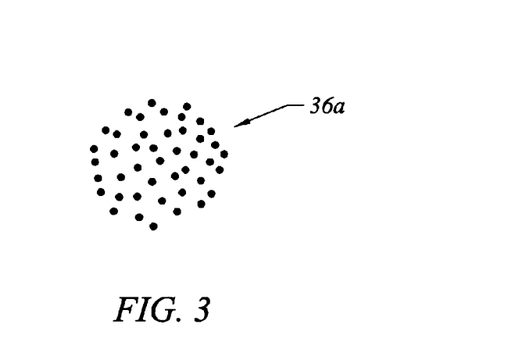
FIG. 3 is a simplified representation of the material from which an imprinting layer, shown in FIG. 2, is comprised before being polymerized and cross-linked.
Figure 4:
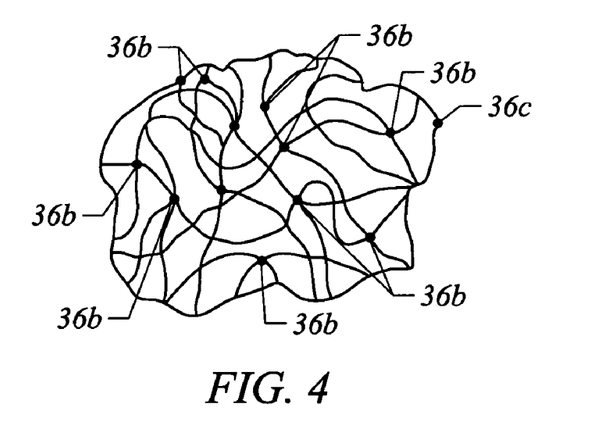
FIG. 4 is a simplified representation of cross-linked polymer material into which the material shown in FIG. 3 is transformed after being subjected to radiation.

Referring to FIGS. 2 and 3, a conformable region, such as imprinting layer 34, is disposed on a portion of surface 32 that presents a substantially planar profile. It should be understood that the conformable region may be formed using any known technique to produce conformable material on surface 32. In accordance with one embodiment of the present invention, the conformable region consists of imprinting layer 34 being deposited as a plurality of spaced-apart discrete droplets 36 of material 36a on substrate 31, discussed more fully below. Imprinting layer 34 is formed from a low molecular weight material 36a that is concurrently polymerized and cross-linked to record the original pattern therein, defining a recorded pattern. Material 36a is shown in FIG. 4 as being polymerized and cross-linked, forming cross-linked polymer material 36c. Cross-linking is shown at points 36b.

Figure 5:
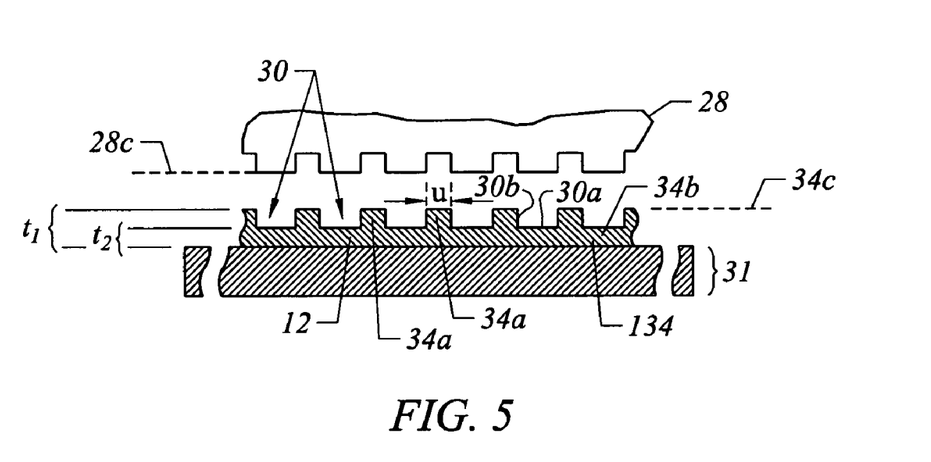
FIG. 5 is a simplified elevation view of a mold spaced-apart from the imprinting layer, shown in FIG. 1, after patterning and solidification/polymerization of the imprinting layer.

Referring to FIGS. 2, 3 and 5, the pattern recorded in imprinting layer 34 is produced, in part, by mechanical contact with mold 28. To that end, imprint head 18 reduces the distance "d" to allow imprinting layer 34 to come into mechanical contact with mold 28, spreading droplets 36 so as to form imprinting layer 34 with a contiguous formation of material 36a over surface 32. In one embodiment, distance "d" is reduced to allow sub-portions 34a of imprinting layer 34 to ingress into and to fill recessions 28a.

To facilitate filling of recessions 28a, material 36a is provided with the requisite properties to completely fill recessions 28a while covering surface 32 with a contiguous formation of material 36a. In accordance with one embodiment of the present invention, sub-portions 34b of imprinting layer 34 in superimposition with protrusions 28b remain after the desired, usually minimum distance "d," has been reached, leaving sub-portions 34a with a thickness $t_1$ and sub-portions 34b with a thickness, $t_2$. Thicknesses "$t_1$" and "$t_2$" may be any thickness desired, dependent upon the application.

Referring to FIGS. 2, 3 and 4, after a desired distance "d" has been reached, radiation source 22 produces actinic radiation that polymerizes and cross-links material 36a, forming polymer material 36c in which a substantial portion thereof is cross-linked. As a result, material 36a transforms to material 36c, which is a solid, forming imprinting layer 134, shown in FIG. 5. Specifically, material 36c is solidified to provide side 34c of imprinting layer 134 with a shape conforming to a shape of a surface 28c of mold 28, with imprinting layer 134 having recesses 30 (the bottom of the recesses may be referred to as a residual layer). After imprinting layer 134 is transformed to consist of material 36c, shown in FIG. 4, imprint head 18, shown in FIG. 2, is moved to increase distance "d" so that mold 28 and imprinting layer 134 are spaced-apart.

Referring to FIG. 5, additional processing may be employed to complete the patterning of substrate 31. For example, substrate 31 and imprinting layer 134 may be etched to transfer the pattern of imprinting layer 134 into substrate 31, providing a patterned surface (not shown). To facilitate etching, the material from which imprinting layer 134 is formed may be varied to define a relative etch rate with respect to substrate 31, as desired.

To that end, etching may be performed in a two-step process. S. C. Johnson, T. C. Bailey, M. D. Dickey, B. J. Smith, E. K. Kim, A. T. Jamieson, N. A. Stacey, J. G. Ekerdt, and C. G. Willson describe suitable etch processes in an article entitled "Advances in Step and Flash Imprint Lithography," *SPIE Microlithography Conference*, February 2003, which is available on the Internet at www.molecularimprints.com, and is incorporated by reference herein. As set forth in the article, the first etch step, referred to as a "break-through etch," anisotropically removes residual cross-linked material 134 to break through to an underlying transfer layer (in this respect, better etch selectivity is enabled by keeping the residual layer small). The second etch step, referred to as a "transfer etch," uses the remaining pattern in cross-linked material 134 as an etch mask to transfer the pattern into the underlying transfer layer. In one embodiment, silicon in cross-link material 134, and the lack of silicon in the transfer layer, provides etch selectivity therebetween. In such an embodiment, the etching may be done in a LAM Research 9400SE obtained from Lam Research, Inc. of Fremont, Calif. For example, and without limitation, a halogen "breakthrough etch" may be utilized which comprises an anisotropic halogen reactive ion etch ("RIE") rich in fluorine, i.e., wherein at least one of the precursors was a fluorine-containing material (for example, and without limitation, a combination of $CHF_3$ and $O_2$, where the organosilicon nature of cross-linked material 134 may call for the use of a halogen gas). Other suitable halogen compounds include, for example, and without limitation, $CF_4$. This etch is similar to a standard $SiO_2$ etch performed in modern integrated circuit processing. Next, an anisotropic oxygen reactive ion etch may be used to transfer the features to underlying substrate 31 wherein the remaining silicon containing features serve as an etch mask to transfer the pattern to underlying substrate 31. The "transfer etch" may be achieved, for example, and without limitation, with a standard, anisotropic, oxygen RIE processing tool. However, in general, any suitable etch process may be employed, dependent upon the etch rate desired and the underlying constituents that form substrate 31 and imprinting layer 134. Exemplary etch processes may include plasma etching, reactive ion etching, chemical wet etching and the like.

Referring to both FIGS. 1 and 2, exemplary radiation source 22 may produce ultraviolet radiation; however, any known radiation source may be employed. The selection of radiation employed to initiate the polymerization of the material in imprinting layer 34 is known to one skilled in the art and typically depends on the specific application which is desired. Furthermore, the plurality of features on mold 28 are shown as recessions 28a extending along a direction parallel to protrusions 28b that provide a cross-section of mold 28 with a shape of a battlement. However, recessions 28a and protrusions 28b may correspond to virtually any feature required to create an integrated circuit and may be as small as a few tenths of nanometers.

Referring to FIGS. 1, 2 and 5, the pattern produced by the present patterning technique may be transferred into substrate 31 to provide features having aspect ratios as great as 30:1. To that end, one embodiment of mold 28 has recessions 28a defining an aspect ratio in a range of 1:1 to 10:1. Specifically, protrusions 28b have a width $W_1$ in a range of about 10 nm to about 5000 µm, and recessions 28a have a width $W_2$ in a range of 10 nm to about 5000 µm. As a result, mold 28 and/or template 26, may be formed from various conventional materials, such as, but not limited to, fused-silica, quartz, silicon, organic polymers, siloxane polymers, borosilicate glass, fluorocarbon polymers, metal, hardened sapphire and the like.

Referring to FIGS. 1, 2 and 3, the characteristics of material 36a are important to efficiently pattern substrate 31 in light of the deposition process employed. As mentioned above, material 36a is deposited on substrate 31 as a plurality of discrete and spaced-apart droplets 36. The combined volume of droplets 36 is such that material 36a is distributed appropriately over an area of surface 32 where imprinting layer 34 is to be formed. As a result, imprinting layer 34 is spread and patterned concurrently, with the pattern being subsequently set into imprinting layer 34 by exposure to radiation, such as ultraviolet radiation. As a result of the deposition process, it is desired that material 36a have certain characteristics to facilitate rapid and even spreading of material 36a in droplets 36 over surface 32 so that all thicknesses $t_i$ are substantially uniform and all thicknesses $t_2$ are substantially uniform. The desirable characteristics include having a low viscosity, for example, and without limitation, in a range of about 0.5 to about 5 centipoise (cps), as well as the ability to wet surface of substrate 31 and mold 28 and to avoid subsequent pit or hole formation after polymerization. With these characteristics satisfied, imprinting layer 34 may be made sufficiently thin while avoiding formation of pits or holes in the thinner regions, such as sub-portions 34b, shown in FIG. 5. However, the characteristics of material 36a are process dependent and may vary as desired. For example, the viscosity may be 100 cps or greater.

The constituent components that form material 36a to provide the aforementioned characteristics may differ. This results from substrate 31 being formed from a number of different materials. As a result, the chemical composition of surface 32 varies dependent upon the material from which substrate 31 is formed. For example, substrate 31 may be formed from, silica, indium phosphide, lithium niobate, lithium tantalate, silicon, plastics, gallium arsenide, mercury telluride, and the like. Additionally, substrate 31 may include one or more layers in sub-portion 34b, for example, dielectric layer, metal layer, semiconductor layer, planarization layer and the like.

Referring to FIGS. 2, 3 and 4, it is desired, however, that material 36a include components to satisfy desired release characteristics when mold 28 interfaces with both material 36a and material 36c. Specifically, to ensure efficient filling of features of mold 28, it is desired that the interface of mold 28 and material 36a be established so that wetting of mold 28 by imprinting material 36a is facilitated. However, once material 36a is solidified into material 36c, material 36a should preferentially adhere to surface 32 of substrate 31 and easily release from mold 28. In this fashion, distortions in the pattern recorded in solidified material 36c are minimized. The preferential adhesion of material 36c to substrate 31 is referred to as release characteristics. The release characteristics of imprinting material 36c are measured employing an adhesion test described by Taniguchi et al. in *Measurement of Adhesive Force Between Mold and Photocurable Resin in Imprint Technology*, Japanese Journal of Applied Physics, part 1, vol. 40, beginning at page 4194 (2002). It has been discovered that desirable values for these release characteristics are: (a) an adhesion force to mold 28, for example, and without limitation, of about 0.15 kg or less; and (b) an adhesion force to substrate 31, for example, and without limitation, of about 1.14 kg or more. It is desired that the ratio of adhesion forces, i.e., the adhesion force of substrate 31/the adhesion force of mold 28 [hereinafter referred to as the adhesion ratio] be 5 or greater.

In addition to the above-described release characteristics, when designing an imprinting material for use in imprint lithography, further considerations include: (a) low viscosity, for example, and without limitation, a viscosity of 5 centipoise or less, to enable desirable wetting and spreading on the substrate and rapid fill of the features on the imprint template (it is better if the viscosity is sufficiently low so that minimal pressure (for example, and without limitation, a pressure of about 2-4 psi) with minimal or no additional heating to move the imprinting material into features of an imprint template); (b) low vapor pressure so that there is little evaporation (evaporation is a problem since the droplets of imprinting material may be on the order of 80 pico-liters, and this results in droplets having a large ratio between surface area and volume); (c) the use of a suitable initiator to initiate polymerization upon exposure to actinic radiation, e.g., UV radiation, thermal radiation and the like; (d) a monomer component that satisfies the low viscosity characteristics in a liquid state of the composition and provide suitable mechanical strength in a solid cured state of the composition; and (e) silylated monomers to provide the silicon desired to provide etch selectivity.

In addition to the above, we have discovered macroscopic mechanical properties of a polymerized imprinting material that is desired to be taken into consideration when designing an appropriate imprinting material. These include: (a) tensile modulus, for example, and without limitation, of about 100-400 MPa or greater—typically, the higher the better; (b) break stress, for example, and without limitation, of about 3-12 MPa or greater—typically, the higher the better; and (c) elongation at break, for example, and without limitation, of 2% or more.

The design of a suitable imprinting material is an iterative procedure that focuses on materials in the following order: (a) formulation volatility (i.e., use of low vapor pressure components); (b) viscosity control (i.e., use of low viscosity components); (c) rapid polymerization kinetics, e.g., less than a minute and more suitable less than two seconds; (d) component miscibility; (e) mechanical properties (tensile modulus, break stress, elongation at break, and $T_g$); (f) wetting and spreading (fluid flow behavior); and (g) adhesions (low to the imprint template and high to the substrate).

The requirement of low viscosity may restrict the choice of components used to fabricate the imprinting material. To build up the strength of the polymerized material based on non-polar monomers, one may compromise and add higher viscosity components. For example, identified is isobornyl acrylate as the building block with silicon containing acrylate monomer components being added to provide silicon for etch selectivity. Typically, the high viscosity components are added judiciously to maintain an overall viscosity of imprinting material 36a to be less than 5 cps.

We have designed an imprinting material by taking into account the design considerations set forth above, and adding the use of a fluorinated surfactant to satisfy desired release characteristics. An exemplary composition for material 36a that utilizes a fluorinated surfactant is produced by mixing (with exemplary proportions being given in weight): (i) acryloxymethylpentamethyldisiloxane (for example, and without limitation, about 37 gm) which is available under the designation XG-1064 from Gelest, Inc. of Morrisville, Pa., (ii) isobornyl acrylate ("IBOA") (for example, and without limitation, about 42 gm) that is available from Aldrich Chemical Company of Milwaukee, Wis., (iii) ethylene glycol diacrylate (for example, and without limitation, about 18 gm) that is available from Aldrich Chemical Company of Milwaukee, Wis., (iv) a UV photoinitiator, for example, and without limitation, 2-hydrozy-2-methyl-1-phenyl-propan-1-one (for example, and without limitation, about 3 gm) that is available under the designation Darocur 1173 from CIBA® of Tarrytown, N.Y.), and (v) FSO-100 (for example, and without limitation, about 0.5 gm) where FSO-100 is a surfactant that is available under the designation ZONYL® FSO-100 from DUPONT™ (FSO-100 has a general structure of $R_1R_2$ where $R_1 = F(CF_2CF_2)_y$, with Y being in a range of 1 to 7, inclusive and $R_2 = CH_2CH_2O(CH_2CH_2O)_xH$, where X is in a range of 0 to 15, inclusive).

An alternative composition for material 36a is produced by mixing (with exemplary proportions being given in weight): (i) acryloxymethylpentamethyldisiloxane (for example, and without limitation, about 37 gm) which is available under the designation XG-1064 from Gelest, Inc. of Morrisville, Pa., (ii) isobornyl acrylate ("IBOA") (for example, and without limitation, about 42 gm) that is available from Aldrich Chemical Company of Milwaukee, Wis., (iii) ethylene glycol diacrylate (for example, and without limitation, about 18 gm) that is available from Aldrich Chemical Company of Milwaukee, Wis., (iv) a UV photoinitiator, for example, and without limitation, 2-hydrozy-2-methyl-1-phenyl-propan-1-one (for example, and without limitation, about 3 gm) that is available under the designation Darocur 1173 from CIBA® of Tarrytown, N.Y.), and (v) FC4432 (for example, and without limitation, about 0.5 gm) where FC4432 is a polymeric surfactant that is available from 3M Company under the designation FLUORAD® FC4432.

Another alternative composition for material 36a is produced by mixing (with exemplary proportions being given in weight): (i) acryloxymethylpentamethyldisiloxane (for example, and without limitation, about 37 gm) which is available under the designation XG-1064 from Gelest, Inc. of Morrisville, Pa., (ii) isobornyl acrylate ("IBOA") (for example, and without limitation, about 42 gm) that is available from Aldrich Chemical Company of Milwaukee, Wis., (iii) ethylene glycol diacrylate (for example, and without limitation, about 18 gm) that is available from Aldrich Chemical Company of Milwaukee, Wis., (iv) a UV photoinitiator, for example, and without limitation, 2-hydrozy-2-methyl-1-phenyl-propan-1-one (for example, and without limitation, about 3 gm) that is available under the designation Darocur 1173 from CIBA® of Tarrytown, N.Y.), and (v) FC4430 (for example, and without limitation, about 0.5 gm) where FC4430 is a polymeric surfactant that is available from 3M Company under the designation FLUORAD® FC4430.

In addition to the silicon containing composition for material 36a, a non-silicon-containing composition for material 36a may be employed. An exemplary non-silicon-containing composition includes i) approximately 55 gm isobornyl acrylate, ii) approximately 27 gm n-hexyl acrylate, iii) approximately 15 gm ethylene glycol diacrylate, iv) approximately 0.5 gm of the ZONYL® FSO-100 surfactant, and v) the DAROCUR® initiator that is approximately 3 gm of the composition.

An additional non-silicon-containing composition for material 36a, includes i) approximately 55 gm isobornyl acrylate, ii) approximately 27 gm n-hexyl acrylate, iii) approximately 15 gm ethylene glycol diacrylate, iv) approximately 0.5 gm of the FC4432 surfactant, and v) the DAROCUR initiator that is approximately 3 gm of the composition.

Another non-silicon-containing composition for material 36a includes i) approximately 55 gm isobornyl acrylate, ii) approximately 27 gm n-hexyl acrylate, iii) approximately 15 gm ethylene glycol diacrylate, iv) approximately 0.5 gm of the FC4430 surfactant, and v) the DAROCUR initiator that is approximately 3 gm of the composition. Each of the above-identified compositions also includes stabilizers that are well known in the chemical art to increase the operational life of the composition.

In yet another example of a non-silicon-containing composition included are i) approximately 47 gm of isobornyl acrylate, ii) approximately 25 gm of n-hexyl acrylate, iii) approximately 25 gm of ethylene glycol diacrylate, iv) approximately 0.5 gm of the ZONYL® FSO-100 surfactant, and v) the DAROCUR® initiator that is approximately 3 gm of the composition.

In yet another non-silicon-containing composition for material 36a a surfactant mixture is included that comprises of a non-fluorinated surfactant and a fluorinated surfactant. An exemplary composition includes i) approximately 55 gm isobornyl acrylate, ii) approximately 27 gm n-hexyl acrylate, iii) approximately 15 gm ethylene glycol diacrylate, and iv) the DAROCUR® initiator that is approximately 3 gm of the composition and 0.5 gm of a surfactant mixture. An exemplary surfactant mixture consists of 0.25 gm of FC4432 and 0.25 gm of a tri-siloxane surfactant available under the designation Sylgard® 309 from Dow Corning Corporation of Auburn, Mich.

Similarly, the surfactant mixture may be used in conjunction with a silicon-containing composition described above. An exemplary composition includes (i) acryloxymethylpentamethyldisiloxane (for example, and without limitation, about 37 gm) (ii) isobornyl acrylate ("IBOA") (for example, and without limitation, about 42 gm) (iii) ethylene glycol diacrylate (for example, and without limitation, about 18 gm), (iv) the Darocur 1173 initiator (for example and without limitation 3 gm) and (v) an exemplary surfactant mixture consisting of 0.25 gm of FC4432 and 0.25 gm of a tri-siloxane surfactant available under the designation Sylgard® 309 from Dow Corning Corporation of Auburn, Mich.

Each of the above-identified compositions may also include stabilizers that are well known in the chemical art to increase the operational life of the composition. The surfactant comprises less than 1% of the imprinting material. However, the percentage of the surfactant may be greater than 1%.

An advantage provided by the above-described imprinting material is that they abrogates the need for an a priori release layer, i.e., a separate hydrophobic and/or low surface energy release layer disposed on imprint template 28. Specifically, the inclusion of the surfactants in the compositions provide desirable release properties to mold 28 and imprinting layer 34 so as to reduce, if not avoid, degradation of, or distortions in, the pattern recorded in the imprinting layer 34.

Figure 6:
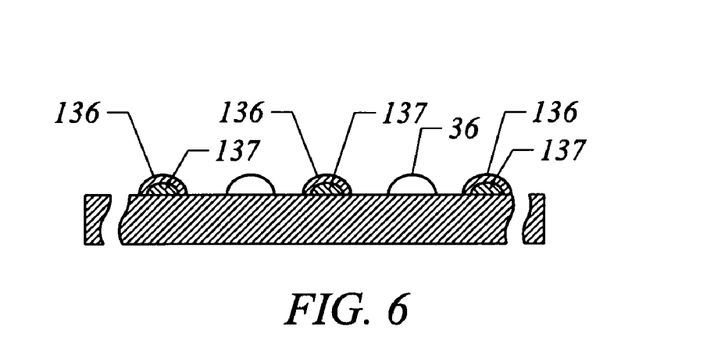
FIG. 6 is a simplified elevation view of the imprint material disposed on a substrate in accordance with the present invention.

Referring to FIG. 6, it is believed that surfactant molecules in droplets 36 of the imprinting material preferentially move toward the gas-liquid interface in less than about 1 second. As such, it is believed that droplets 36 have a higher concentration of the surfactant in region 136 as compared to region 137 in which the polymerizable components are concentrated. It is believed that this is the result of an energy minimization process wherein the surfactant tends to move to the gas-liquid interface and its hydrophobic end aligns towards the gas. For example, it is believed that the hydrophobic end of the surfactant is aligned to project out of the liquid and into the gas, and the hydrophilic end is aligned to project into the liquid. However, when the imprinting material contacts the surface of the imprint template, it is believed that exposed silanol bonds on the surface of the imprint template cause the hydrophilic end of the surfactant molecule to flip and to contact the exposed silanol bonds so that the hydrophobic end faces downwardly e.g., outwardly from the surface of the imprint template to enable adhesion reduction. It is further believed that weakly bound surfactant lamella may also be formed at the surface of the imprint template, which lamella may comprise, for example, two (2) layers of surfactant molecules.

Referring to FIG. 2, an additional advantage provided by the above-described imprinting material is that template cleaning and preparation time is shortened; therefore, the overall process is simplified. Of course, the above-described imprinting material may be employed with an a priori release layer, such as those known in the prior art.

Another manner by which to improve the release properties of mold 28 includes pre-conditioning the pattern of mold 28 by exposing the same to a conditioning mixture including an additive that will remain on mold 28 to reduce the surface energy of the mold surface. An exemplary additive is a surfactant.

The above-described imprinting materials are useful in providing substantially high feature fidelity imprint lithography, while providing suitable operational life to an imprint template. For example, an imprint template having a patterning area, i.e., mold, of 25×25 mm having 40 to 50 nm features was employed to generate five hundred (500) imprints with minimal pattern feature degradation and distortion.

An exemplary imprinting method using the imprinting material described above includes as a first step, pretreating the surface of a quartz imprint template to create hydrophilic bonds at the surface, for example, and without limitation, silanol (Si—OH) bonds. In accordance with one or more embodiments of the present invention, the surface of the imprint template is dipped in a 2.5:1 solution of $H_2SO_4$ and $H_2O_2$ to hydrolyze the surface, i.e., to create silanol bonds at the surface. This is referred to as piranha cleaning.

As a next step, the surface is further pre-treated by spraying the surface of the imprint template with a diluted surfactant solution (for example, and without limitation, 0.1% in isopropyl alcohol (IPA). The surfactant efficiently at the surface of the imprint template with hydrophobic ends projecting outwardly from the surface. Such alignment is promoted by piranha cleaning the surface to create silanol bonds on the surface. Exposure of the surface of the imprint template may be achieved by virtually any method known in the art, including dipping the surface into a volume of pre-treatment solution, wiping the surface with a cloth saturated with pre-treatment solution, and spraying a stream of pre-treatment solution onto the surface. The IPA in the pre-treatment solution may be allowed to evaporate before using the mold 28. In this manner, the IPA facilitates removing undesired contaminants from the surface while leaving the surfactant adsorbed thereto. Because the surfactant includes a hydrophobic end and a hydrophilic end, the silanol bonds promote alignment of the surfactant so that the hydrophilic end "attaches" to the —OH end of the silanol bonds, and the hydrophobic end points away from the surface. In a next step, a gap between the imprint template and the substrate is purged of air using, for example, and without limitation, a ~5 psi helium purge.

In a next step, the imprinting material containing the surfactant is applied to the substrate, for example, and without limitation, by placing a pattern of substantially equidistant droplets of the following imprinting material on the substrate, or by spin-coating, or by any other method known to those of ordinary skill in the art. In this example, the substrate was covered with a transfer layer whose top layer was a cross-linked BARC material (BARC or "bottom antireflective coating" is an organic antireflective coating that is typically produced by a spin-on process). The BARC layer was used to prevent intermixing between an imprinting material and a transfer layer, which intermixing may be particularly problematic when using an imprinting material comprised of low viscosity components used herein, because such components have solvency toward many polymers. Substantial intermixing may cause problems, such as, for example, and without limitation, distortion of features during subsequent etching processes. This can be particularly problematic when feature thicknesses are as small as 50 to 100 nm. Next, the familiar steps of imprint lithography are carried out, i.e., exposure to actinic radiation to polymerize the imprinting material; separation of the imprint template and the substrate; and selective etching to transfer the feature pattern to the substrate.

It is believed that even when pre-treating the surface of the imprint template as described above utilizing one or more surfactants, the one or more surfactants are adsorbed to the silanol surface of the imprint template ultimately become abraded away. However, as was described above, the surfactant contained in the imprinting material rapidly comes to the gas-liquid surface of the droplets, and the surface of the imprint template is re-coated as a normal consequence of imprinting. As such, in accordance with one or more embodiments of the present invention, the pre-treatment step of applying the surfactant solution to the surface of the imprint template may be eliminated. In fact, in accordance with one or more further embodiments of the present invention, the imprint template may be contacted a few times with the imprinting material as a replacement for the pre-treatment step of applying the surfactant solution to the surface.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. An imprinting material for use in imprint lithography comprising:
    a composition having a viscosity associated therewith and including a surfactant, a polymerizable component, and an initiator responsive to a stimuli to vary said viscosity in response thereto, with said composition, in a liquid state, having said viscosity being lower than about 100 centipoises, a vapor pressure of less than about 20 Torr, and in a solid cured state a tensile modulus of greater than about 100 MPa, a break stress of greater than about 3 MPa and an elongation at break of greater than about 2%.

2. The imprinting material as recited in claim 1 wherein said surfactant comprises a non-ionic surfactant.

3. The imprinting material as recited in claim 1 wherein said surfactant comprises a fluorinated surfactant.

4. The imprinting material as recited in claim 1 wherein said surfactant comprises a fluorinated non-ionic surfactant.

5. The imprinting material as recited in claim 1 wherein said monomer is selected from the group consisting of epoxies, acrylates, methacrylates and vinyl ethers.

6. The imprinting material as recited in claim 1 wherein said monomer is selected from a set of polymerizable component containing silicon therein.

7. The imprinting material as recited in claim 1 wherein said monomer is a substituted acrylate.

8. The imprinting material as recited in claim 1 wherein said monomer is a silicon-containing acrylate.

9. The imprinting material as recited in claim 1 wherein said monomer is selected from the group of substituted acrylates consisting of mono-substituted acrylates and multifunctional-substituted acrylates.

10. The imprinting material as recited in claim 1 wherein said initiator is selected from the group consisting of photo initiators and thermal initiators.

11. The imprinting material as recited in claim 1 wherein said initiator is a radical photoinitiator.

12. The imprinting material as recited in claim 1 wherein said viscosity in said liquid state is less than about 25 centipoises.

13. The imprinting material as recited in claim 1 wherein said viscosity in said liquid state is less than about 10 centipoises.

14. The imprinting material as recited in claim 1 wherein said viscosity in said liquid state is less than about 5 centipoises.

15. The imprinting material as recited in claim 1 wherein said vapor pressure is lower than about 5 Torr.

16. The imprinting material as recited in claim 1 wherein said vapor pressure is lower than about 2 Torr.

17. The imprinting material as recited in claim 1 wherein said tensile modulus is 100 MPa or greater.

18. The imprinting material as recited in claim 1 wherein said break stress of about 3 MPa or greater.

19. The imprinting material as recited in claim 1 wherein said elongation at break is 8% or more.

* * * * *